TELEVISION TUNER HAVING COMMON VERNIER REACTANCE PRESETTABLY ADJUSTABLE FOR EACH CHANNEL

Filed Oct. 24, 1957 2 Sheets-Sheet 1

INVENTORS
ALARICO A. VALDETTARO
AND STANLEY R. MEADOWS
BY Mason, Kolehmainen, Rathburn and Wyss
ATTORNEYS.

INVENTORS
ALARICO A. VALDETTARO
AND STANLEY R. MEADOWS
BY
Mason, Kolehmainen, Rathburn and Wyss
ATTORNEYS.

United States Patent Office 2,947,866
Patented Aug. 2, 1960

2,947,866

TELEVISION TUNER HAVING COMMON VERNIER REACTANCE PRESETTABLY ADJUSTABLE FOR EACH CHANNEL

Alarico A. Valdettaro and Stanley R. Meadows, Bloomington, Ind., assignors to Sarkes Tarzian, Inc., Bloomington, Ind., a corporation of Indiana Filed Oct. 24, 1957, Ser. No. 692,185

9 Claims. (Cl. 250—40)

The present invention relates to television tuners, and more particularly, to television tuners of the type which employ a rotary selector switch having a plurality of channel selecting positions, one position being provided for each television channel to be received.

In present-day television tuners of the rotary switch type, a plurality of switch wafers are adapted to be actuated in unison by means of a common, incrementally rotatable channel selector shaft for selectively connecting certain ones of a plurality of tuned circuit elements into operative circuit relationship with the other tuner elements. For each channel selecting position of the shaft, the oscillator portion of the tuner is tuned, by certain ones of the selected tuned circuit elements, to a particular frequency so that when the oscillator signal is heterodyned with the received signals, the selected one of the received signals is converted to an intermediate frequency signal of proper frequency for efficient translation through the IF channel of the associated receiver.

Because of the difficulty of accurately setting the values of the tuned circuit elements, and because of the desirability of accurately tuning the oscillator to each of a plurality of predetermined frequencies, it has been found necessary to include in the oscillator circuit a reactance device having an adjustable value. Moreover, inasmuch as the values of other circuit parameters in the oscillator such, for example, as tube constants, vary with the age of the tuner, it is desirable, in order to insure that the receiver operates at maximum efficiency at all times, that this adjustable reactance be so constructed as to be readily adjustable by the user of the receiver whenever necessary. In accordance with the practices of the prior art, a vernier tuning shaft, usually concentrically mounted with respect to the channel selector shaft, is connected to the adjustable reactance and is adjustable by the viewer each time that he retunes the receiver to select a different channel.

In order to eliminate this frequent adjustment of the vernier tuning shaft of the tuner, it has been proposed to provide a separate vernier tuning reactance for each channel and to employ the wafer switches to selectively connect a different preadjusted one of these reactances into the oscillator circuit simultaneously with the connection of a new set of tuned circuit elements into the tuner circuits by rotation of the channel selector shaft. A primary disadvantage of such an arrangement is that in each tuner a large number of adjustable capacitors must be provided which creates a number of problems. One of these problems is that since such capacitors are relatively large, they occupy a considerable amount of space in the tuner and thus impede the trend of modern design toward smaller and smaller tuners. Another problem is that such capacitors are relatively expensive and the use of large numbers of them appreciably increases the cost of each tuner.

In order to enable a reduction in the overall size of a tuner, to reduce the manufacturing cost of the tuner and to improve the reliability of operation thereof, it would be desirable to provide a single vernier tuning reactance which is operatively connected in the oscillator circuit and which is adapted to be preadjusted for each channel selecting position of the selector shaft so as to have fixed values of reactance for each of the channel selecting positions of the channel selector shaft. In this manner, the space requirements of the vernier tuning device, which is located within the shielded compartment of the tuner, are minimized, and the effective value of the vernier tuning reactance for each channel selecting position of the tuning shaft may be adjusted when necessary as, for example, by a technician when the set is first installed in the home.

In addition to the provision of means for enabling individual adjustment of the value of the vernier tuning reactance for each channel selecting position of the selector shaft, it would be desirable to provide means for enabling a single adjustment of the value of the reactance of the vernier tuning device for all channel selecting positions of the selector shaft. In this manner any changes which may take place in the tuner and which would equally affect the frequency of oscillation of the oscillator circuit irrespective of the selected channel, can readily be compensated for by adjusting a single member thereby obviating the necessity of adjusting the value of the vernier tuning capacitor for each and every one of the channels carrying signals reproducible by the receiver.

A principal object of the present invention is to provide a new and improved television tuner.

Another object of the present invention is to provide a new and improved tuner which includes a single vernier tuning capacitor connected in circuit relationship with the oscillator and means for adjusting the value of the reactance of this capacitor for each channel selecting position of the main tuning shaft.

A further object of the present invention is to provide a television tuner which includes means for selectively moving individually adjustable members into effective engagement with an adjustable element of a vernier tuning capacitor connected in the oscillator circuit of the tuner so that the individual members may be adjusted to control the value of the vernier tuning capacitor for each channel selecting position of the main tuning shaft.

Another object of the present invention is to provide a television tuner which includes a plurality of separately adjustable means selectively movable into engagement with a vernier tuning capacitor connected in the oscillator circuit of the tuner and a single adjustable member for simultaneously altering the adjustment of all of said members.

The invention, both as to its organization and method of operation, together with further objects and advantages thereof, will best be understood by reference to the following detailed description taken in connection with the accompanying drawings, in which.

Figures 1, 2, 3:
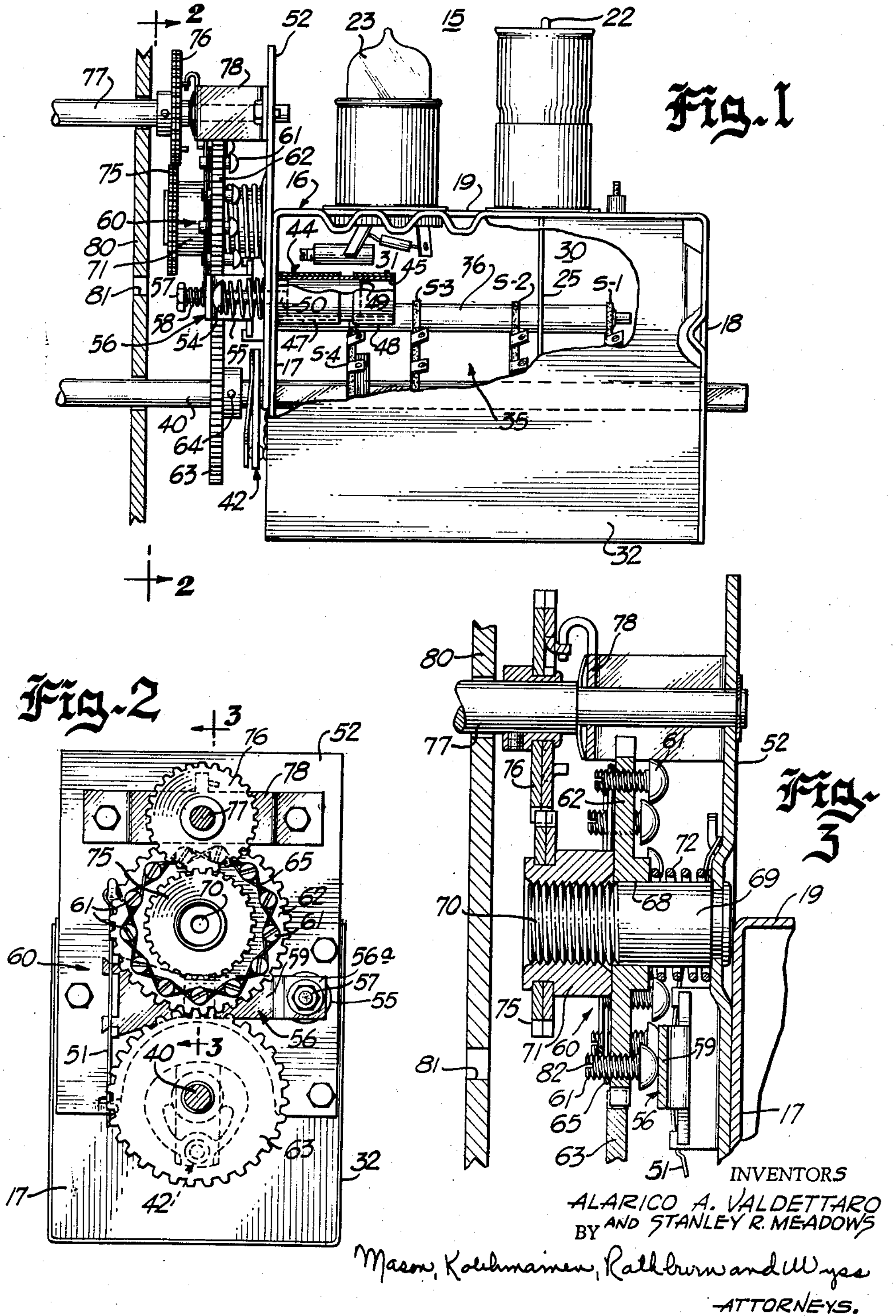
Fig. 1 is a side elevational view of a television tuner embodying certain features of the present invention with certain portions of the shielding cover broken away to show the variable tuning capacitor and other circuit elements of the tuner.
Fig. 2 is an end view of the tuner taken from line 2—2 of Fig. 1.
Fig. 3 is a fragmentary sectional view taken along the line 3—3 of Fig. 2.

Referring now to the drawings and more particularly to Figs. 1 to 3, inclusive, thereof, the present invention is illustrated as comprising a television tuner, indicated generally at 15, which is provided with a substantially U-shaped chassis 16 having front and rear walls 17 and 18 and a top deck portion 19 on which are mounted the tube sockets for a pair of tubes 22 and 23. Preferably, the tube 22 is a pentode and acts as the radio frequency amplifier of the tuner, the tube 23 being preferably a double triode functioning as both the mixer and local oscillator of the tuner. A metallic partition 25 is secured to the chassis deck 19 and to the rear wall 18 by suitable means (not shown) and separates the chassis into a rear RF tuning compartment 30 and a forward mixer-oscillator tuning compartment 31. A sheet metal cover 32 is wrapped around the exposed sides and bottom of the chassis 16 so as to cooperate with the other portions thereof to completely enclose and shield the tuning compartments 30 and 31. The partition 25 supports the rear end of a rotary channel selector switch indicated generally at 35, the forward end of the switch 35 being supported on the front wall 17. The selector switch 35 comprises a plurality of switch wafers S–1, S–2, S–3, and S–4, which are supported on suitable rods 36 which extend through the partition 25 and are secured to the front wall 17. Any suitable means, such, for example, as ceramic spacers may be used to fixedly position the wafers S–1, S–2, S–3, and S–4 in the desired spaced apart relationship. Each of the switch wafers S–1, S–2, S–3, and S–4 includes a stator portion which is secured by suitable means to the chassis and is provided with a central opening within which is positioned the switch rotor, all of the rotors of the switch wafers being controlled from a main tuning or channel selector shaft 40 which extends transversely through openings of a configuration corresponding to the cross section of the shaft 40 in each switch rotor.

In accordance with conventional practice, each of the switch wafers is provided with a plurality of spaced stator contacts which are secured to the stator plate of the switch wafer to be selectively engaged by contact means which are mounted on the rotor for selective engagement with different ones of the stator contacts for each angular channel selecting position of the main tuning shaft 40. Moreover, a suitable detent arrangement 42 (Fig. 2) is effectively interconnected between the selector shaft 40 and the front wall 17 of the chassis 16 to facilitate the accurate positioning of the shaft 40 in each of the channel selecting positions.

Figures 4, 5:
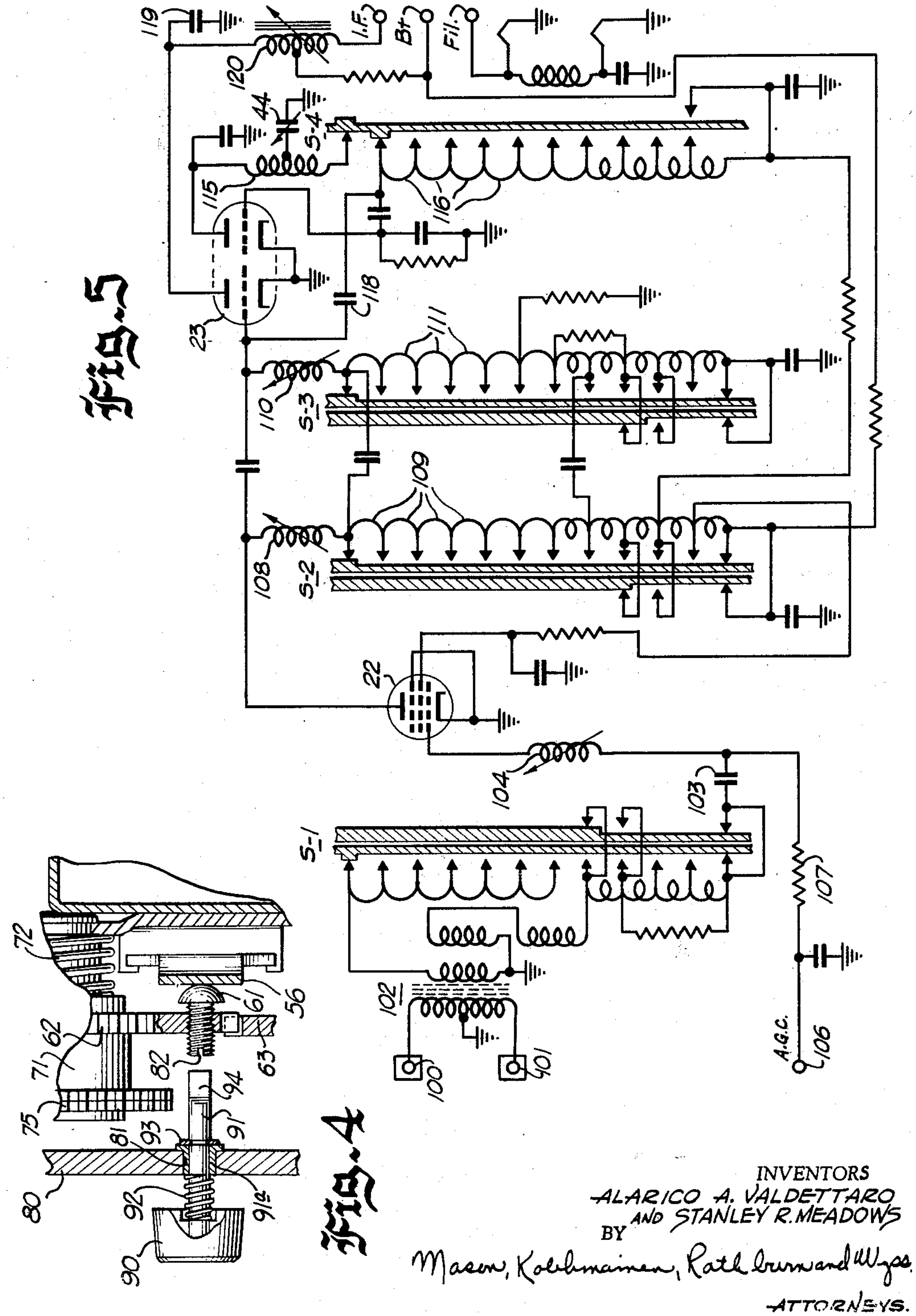
Fig. 4 is a fragmentary sectional view of a television receiver embodying another aspect of the present invention.
Fig. 5 is an electric circuit diagram of the tuner shown in Fig. 1.

Accordingly, as the shaft 40 is rotated to successive channel selecting positions, successive ones of the stator contacts are sequentially connected to the contact means on the rotors. A plurality of tuning elements, more fully described hereinafter in connection with Fig. 5, are respectively connected to the stator contacts so that different ones of the tuning elements are connected in circuit with the antenna, mixer and oscillator sections of the tuner for each of the channel selecting positions of the tuning shaft 40. Accordingly, as the main tuning shaft 40 is rotated to retune the receiver, different ones of these tuned circuit elements which are connected to the contacts on the wafer section S–4 are connected into circuit relationship with the oscillator circuit, thereby to selectively control the frequency of oscillation thereof.

In order to permit fine adjustment of the frequency of oscillation of the oscillator for each channel selecting position of the main tuning shaft 40, a variable tuning capacitor 44 is connected in the oscillator circuit to enable adjustment of the frequency of oscillation of the oscillator throughout a relatively narrow range as compared to the range of frequencies controlled by the tuned circuit elements of the wafer section S–4 which are selectively connected in circuit relationship with the oscillator as the main tuning shaft 40 is rotated through 360 degrees. As shown, the vernier tuning capacitor 44 comprises a tubular support member 45 formed of an insulating material such, for example, as glass or ceramic, on which a pair of conductive bands 47 and 48 are disposed in spaced apart relation. A conductive slug 49, which is preferably cylindrical in cross section, is slidably mounted in the bore of the support tube 45 so that axial movement of the slug 49 within the tube 45 adjusts the value of capacitance between the capacitor plates 47 and 48. The manner in which the capacitor 44 is connected in circuit relationship with the oscillator is more fully described hereinafter in connection with Fig. 5.

A rod 50, which extends along the principal axis of the tube 45 and is connected to the tuning slug 49, loosely extends through a suitable aperture in the wall 17 and through a support plate 52 which is secured by suitable means such, for example, as a plurality of screws (not shown), to the front of the wall 17. As best shown in Fig. 2, a control lever 56 is pivotally mounted at one end on a spring type head 59 and is provided with an aperture near the opposite end 56*a* thereof through which the rod 50 loosely extends. A pintle 57 is provided on the forward end of the rod 50 and a coil spring 58 is interposed between the pintle 57 and the lever 56 to bias the lever into engagement with a collar 54. The collar 54 is fixedly positioned on the rod 50 intermediate the ends thereof and a coil spring 55 is interposed between the collar 54 and the support plate 52 to bias the tuning slug 49 to a position toward the front of the tuner. Accordingly, pivotal movement of the lever 56 in one direction causes movement of the slug 49 toward the rear of the tuner, thereby to reduce the value of capacitance between the plates 47 and 48 of the vernier capacitor 44, while movement of the lever in the opposite direction causes a decrease in the value of the capacitance of the variable tuning capacitor 44. It will, of course, be understood by those skilled in the art that the size of the slug 49 relative to that of the capacitor plates 47 and 48 is such that movement of the slug 49 through the tube 45 varies the capacitance of the capacitor 44 through a sufficiently wide range to enable an accurate adjustment of the frequency of oscillation of the oscillator for each channel selecting position of the main tuning shaft 40.

In order to control the position of the lever 56 so that the variable tuning capacitor 44 has a particular value for each channel selecting position of the main tuning shaft 40, a vernier tuning adjusting device, generally indicated at 60, is provided. The device 60 includes a plurality of individually adjustable lever actuating members or screws 61 which are mounted in spaced apart relationship about the periphery of a pinion gear or support member 62 for selective engagement with an intermediately reversely bent portion 59 (Fig. 3). The pinion gear 62 mates with a pinion gear 63 of equal diameter which is fixedly attached to the main tuning shaft 40 by means of a set screw 64 so that as the tuning shaft 40 is rotated into each of its channel selecting positions, a different one of the actuating members 61 is moved into engagement with the lever 56 to move the end 56*a* thereof with respect to the collar 54. Inasmuch as the spring 55 biases the collar 54 against the lever 56 and thus biases a reversely bent intermediate portion of the lever 56 against the selected one of the members 61, the tuning slug 49 occupies a position axially of the tube 45 as determined by the axial position of the particular actuating member 61 which engages the lever 56. Although any suitable means may be used to lock the members 61 in their respective adjusted positions, in the illustrated embodiment of the invention a plurality of wires 65 are criss-crossed between the threaded body portions of adjacent ones of the members 61 to firmly engage the threads of the members 61 and prevents spurious rotation thereof due to vibration, etc. of the receiver.

In accordance with the present invention and as best shown in Fig. 3, the gear 62 has a central aperture 68 which is somewhat larger than the external diameter of a stud 69 which is attached to the support plate 52 as by riveting and which has a threaded outer end portion 70 over which a sleeve 71 is threadedly positioned. A suitable coil spring 72 is interposed between the gear 62 and the adjacent wall of the support plate 52 to bias the forward face of the gear 62 into engagement with the rearward face of the sleeve 71. A pinion gear 75 surrounds and is attached to the sleeve 71 and meshes with another pinion gear 76 which is mounted on a vernier tuning shaft 77, which shaft is journaled for rotation in the plate 52 and a bracket 78 which is attached to the plate 52. Accordingly, rotation of the vernier tuning shaft 77 causes the sleeve 71 to rotate with respect to the stud 69 and, therefore, to move toward or away from the plate 52 depending upon the direction of rotation of the shaft 77. It will be noted that as the vernier tuning shaft 77 is rotated, the pinion gear 62 and, therefore, all of the adjustable tuning members 61 are simultaneously moved toward or away from the lever 56. Consequently, in accordance with the present invention, the individual members 61 may be adjusted to compensate for those changes which occur in the parameters of the tuner and alter the frequency of oscillation of the tuner differently for each associated channel, and the vernier tuning shaft 77 may be adjusted to vary the value of the capacitor 44 for all channels and, therefore, to compensate for those changes in the circuit parameters of the tuner 15 which equally affect all of the channels such, as for example, as oscillator tube drift.

It will be understood, of course, that although a vernier tuning shaft 77 and associated structure for controlling the position of the gear 62 with respect to the support plate 52 is preferable, such a mechanism may be omitted. But, of course, should the values of the various circuit parameters in the tuner 15 vary in the tuner not including the shaft 77, all of the individual tuning members 61 must be individually adjusted even though such changes may affect all channels equally.

In those cases where the members 61 are to be factory-adjusted and thereafter adjusted only by the serviceman to compensate for the vicissitudes peculiar to the particular location of the receiver in question, the front wall 80 of the cabinet of the receiver should be provided with a hole 81 opposite the position at which the actuating members 61 are positioned when in engagement with the lever 56 so that a screw driver or the like may be inserted through the hole 81 into the slot 82 (Fig. 3) in the forward end of the selected member 61 to rotate it and thereby adjust the position of the tuning slug 49.

In those instances where the overall vernier tuning shaft 77 and associated mechanism is eliminated, the necessity for adjustment of the members 61 will be more frequent and, therefore, for purposes of economy such adjustment will ordinarily have to be made by the users of the receiver themselves. Therefore, as shown in Fig. 4, a control knob 90 may be provided at the front of the receiver adjacent the main tuning shaft for selective engagement with each of the members 61 to adjust the values of the vernier tuning capacitor 44 for each channel selecting position of the main tuning shaft. In the illustrated embodiment of this aspect of the invention, the knob 90 is supported on a shaft 91 which extends through a bearing **91*a* in the aperture 81 in the wall 80 of the cabinet of the receiver. The knob 90 and shaft 91 are spring-biased in an outward direction by means of a spring 92 which is interposed between the front of the wall 80 and the rear of the knob 90. The spring 92 thus urges a collar 93, which is fixedly secured to the shaft 91, against the inner wall of the cabinet 80. The shaft 91 is provided with a screw driver head 94 which may be moved into the slot 82 in the end of the particular member 61 which at the time is operatively connected to the lever 56. Therefore, by pushing the knob 90 toward the cabinet 80 to compress the spring 92, the head 94 may be moved into selective engagement with the members 61 and the knob 90 may thus be used to adjust the vernier tuning capacitor 44** to control the frequency of oscillation of the oscillator.

Referring now to Fig. 5, there is shown the electrical schematic diagram of the circuit of the tuner of Fig. 1, it being understood that most of the electrical components of this circuit have not been shown in Fig. 1 to simplify illustration thereof. In the schematic diagram of Fig. 5 the switch wafers S–1, S–2, S–3, and S–4 of the tuner of Fig. 1 are shown in developed form to simplify the illustration of the circuit connections thereto, each of these switch wafers being shown with the rotor thereof in the channel 13 position, i.e., the highest frequency channel which may be selected by the tuner. The television signals which are received by an antenna system connected to the antenna terminals 100 and 101 are coupled through the antenna input transformer 102, through the switch wafer S–1 and through the coupling condenser 103 and the tuning coil 104 to the control grid of the RF amplifier tube 22. An AGC voltage from the second detector portion of the television receiver is impressed upon the AGC terminal 106 and is supplied through the resistor 107 and the tuning coil 104 to the control grid of the tube 22. The plate circuit of the tube 22 is tuned by means of the coil 108 and the incremental inductances 109 which may be selectively connected in circuit by means of the switch wafer S–2.

The anode of the tube 22 is capacity coupled to the control grid of the left-hand section of the mixer-oscillator tube 23, this left-hand section of the tube 23 acting as a mixer, the input circuit of which is tuned by means of the coil 110 and the incremental inductances 111 which are selectively connected in circuit by means of the switch wafer S–3. The right-hand section of the tube 23 is employed as the local oscillator of the tuner and the plate circuit of this section of the tube 23 includes a variable inductance 115 to which a plurality of incremental inductances 116 may be selectively added by means of the oscillator switch wafer S–4, the vernier tuning capacitor 44 being connected from a tap on the inductance 115 to ground so as to vary the frequency of the oscillator by one or two megacycles to permit a fine tuning adjustment to the desired television signal. The output of the local oscillator section of the tube 23 is coupled through the condenser 118 to the control grid of the mixer section of the tube 23 and the plate circuit of the left-hand section of the tube 23 is tuned by means of the condenser 119 and the coil 120 to the desired intermediate frequency.

Considering now the operation of the tuner 15, after the tuner has been assembled at the factory the individual tuning members 61 are adjusted so that when the main tuning shaft is disposed in each channel selecting position, the vernier tuning capacitor 44 has the proper value to accurately tune in the selected signal. Thereafter, when a receiver incorporating the tuner 15 is installed in a home, the serviceman performing the installation makes any further adjustments of the members 61 or of the shaft 77 which are necessary to accurately tune the oscillator for the best possible reception of each channel signal. The receiver is then ready for normal use and rotation of the main tuning shaft 40 to each channel selecting position causes the gear 62 to be rotated by the gear 63 and thus selectively to move the corresponding tuning members 61 into operative engagement with the tuning slug 49, no vernier tuning adjustment by the user being necessary. Whenever, however, a slight change in the oscillator frequency is required, because, for example, of the necessity of tuning out a temporary local disturbance, the vernier tuning shaft 77 may be readily adjusted. Also, whenever a change in the value of the vernier tuning capacitor 44 for only a single channel is required, the corresponding tuning member 61 may be adjusted by simply rotating the main tuning shaft 44 to the channel position in question and then rotating the tuning member 61 which is opposite the aperture 80 until it occupies the proper axial position to set the oscillator frequency at the desired value.

While a particular embodiment of the invention has been shown, it will be understood, of course, that it is not desired that the invention be limited thereto since modifications may be made, and it is, therefore, contemplated by the appended claims to cover any such modifications as fall within the true spirit and scope of the invention.

Having thus described the invention, what is claimed and desired to be secured by Letters Patent is:

1. In a television receiver, a chassis comprising an end member and a plurality of side members, a main tuning shaft mounted on at least one of said side members for incremental rotation to a plurality of angularly displaced channel selecting positions, oscillator means mounted on said chassis, a plurality of reactance devices mounted on said chassis, said devices having substantially different reactance values, switch means operatively connected to said shaft for connecting different ones of said devices in circuit relationship with said oscillator means for each of said channel selecting positions of said tuning shaft thereby to cause said oscillator means to oscillate at a substantially different predetermined frequency for each channel selecting position of said tuning shaft whereby said oscillator means is tuned to substantially those frequencies at which said television receiver may best reproduce the television signals transmitted on said channels, and a vernier tuning reactance connected in circuit relationship with said oscillator means for adjusting the frequency of oscillation of said oscillator means throughout a relatively narrow range accurately to tune said oscillator means to those frequencies at which television signals transmitted in said channel may be best reproduced by said receiver, adjusting means including a plurality of mutually exclusive, individually adjustable, rotatable members selectively connectable to said vernier tuning reactance for setting the value of said vernier tuning capacitor to a plurality of desired values, and connector means interconnected between said adjusting means and said main tuning shaft for connecting a different one of said members to said vernier tuning reactance for each of said channel selecting positions of said tuning shaft.

2. A television tuner comprising an oscillator circuit, incrementally rotatable channel selecting switch means for controlling the frequency of oscillation of said circuit, a vernier tuning reactance connected in said circuit for accurately adjusting the frequency of oscillation thereof, and means driven by said switch means for adjusting the value of said reactance to a particular predetermined value for each channel selecting position of said switch means, said adjusting means including a plurality of separately adjustable members for respectively controlling said predetermined value of said reactance for each channel selecting position of said switch means.

3. A television tuner comprising an oscillator circuit, incrementally rotatable channel selecting switch means for controlling the frequency of oscillation of said circuit, a vernier tuning reactance connected in said circuit for accurately adjusting the frequency of oscillation thereof, means driven by said switch means for adjusting the value of said reactance to a particular predetermined value for each channel selecting position of said switch means, said adjusting means including a plurality of separately adjustable members for respectively controlling said predetermined value of said reactance for each channel selecting position of said switch means, and means for simultaneously changing the operative position of all of said members thereby simultaneously to adjust the predetermined value of said reactance for all of said channel selecting positions.

4. A television tuner comprising an oscillator, a tuning shaft, a plurality of tuned circuit elements individual to the different channels to be tuned, means including electrical switching means responsive to rotation of said shaft to each of a plurality of channel selecting positions for connecting different ones of said elements to said oscillator to vary the frequency of oscillation thereof, a common vernier tuning reactance connected in circuit relationship with said oscillator in each of said channel selecting positions for adjusting the frequency of oscillation thereof independently of said tuned circuit elements, and adjusting means responsive to rotation of said tuning shaft for adjusting the value of said reactance to each of a plurality of values corresponding to the channel selecting positions of said tuning shaft, said adjusting means including a plurality of separately adjustable members selectively movable into a position to control the value of said reactance, whereby said members may be individually adjusted to tune said oscillator to particular desired frequencies corresponding to different channel selecting positions of said tuning shaft.

5. A tuner for use in a television receiver including a cabinet in which said tuner is mounted, said tuner comprising an oscillator, a tuning shaft, a plurality of tuned circuit elements individual to the different channels to be tuned, means including electrical switching means responsive to rotation of said shaft to each of a plurality of channel selecting positions for connecting different ones of said elements to said oscillator to vary the frequency of oscillation thereof, a common vernier tuning reactance connected in circuit relationship with said oscillator in each of said channel selecting positions for adjusting the frequency of oscillation thereof independently of said tuned circuit elements, a support member having a plurality of reactance changing members rotatably mounted thereon, a connection between said support member and said tuning shaft for moving a different one of said members into effective reactance changing position relative to said common vernier tuning reactance for each channel selecting position of said tuning shaft, and a vernier tuning adjustment means accessible from outside said cabinet, said vernier tuning adjustment means being selectively movable into operative engagement with the one of said members in said reactance changing position so that said one member may be rotated and the reactance value of said vernier tuning reactance altered for the corresponding channel selecting position of said tuning shaft.

6. A tuner for use in a television receiver including a cabinet in which said tuner is mounted, said tuner comprising an oscillator, a tuning shaft, a plurality of tuned circuit elements individual to different channels to be tuned, means including electrical switching means responsive to rotation of said shaft to each of a plurality of channel selecting positions for connecting different ones of said elements to said oscillator to vary the frequency of oscillation thereof, a common vernier tuning reactance connected in circuit relationship with said oscillator in each of said channel selecting positions for adjusting the frequency of oscillation thereof independently of said tuned circuit elements, a support member having a plurality of reactance changing members rotatably mounted thereon, a connection between said support member and said tuning shaft for moving a different one of said members into effective reactance changing position relative to said common vernier tuning reactance for each channel selecting position of said tuning shaft, and a vernier tuning adjustment means accessible from outside said cabinet, said vernier tuning adjustment means being normally biased to an outer position in which position said vernier tuning adjustment means is out of engagement with said members and being movable inwardly toward said cabinet into operative engagement with the one of said members in said reactance changing position so that said one member may be rotated and the reactance value of said vernier tuning reactance altered for the corresponding channel selecting position of said tuning shaft.

7. A television tuner comprising an oscillator circuit, incrementally rotatable channel selecting switch means for controlling the frequency of oscillation of said circuit in each of a plurality of channel selecting positions, a vernier tuning reactance connected in said circuit for accurately adjusting the frequency of oscillation thereof and including a movable element, a support member having a plurality of independently adjustable members mounted thereon, and a connection between said switch means and said support member for moving a different one of said adjustable members into engagement with said movable element for each channel selecting position of said switch means, whereby said separately adjustable members may be individually adjusted to control the value of said reactance for each channel selecting position of said switch means.

8. A television tuner comprising an oscillator circuit, incrementally rotatable channel selecting switch means for controlling the frequency of oscillation of said circuit in each of a plurality of channel selecting positions and including a rotatable channel selector shaft, a vernier tuning reactance connected in said circuit for accurately adjusting the frequency of oscillation thereof and including a movable element, a support member having a plurality of independently adjustable members mounted thereon, a connection between said shaft and said support member for moving a different one of said adjustable members into effective engagement with said movable element for each channel selecting position of said shaft, whereby said separately adjustable members may be individually adjusted to control the value of said reactance for each channel selecting position of said shaft, and a vernier tuning adjustment member selectively movable into engagement with one of said adjustable members when said one member is in effective engagement with said movable element, whereby the setting of said vernier tuning reactance may be selectively altered in each channel selecting position of said shaft.

9. A television tuner comprising an oscillator circuit, incrementally rotatable channel selecting switch means for controlling the frequency of oscillation of said circuit in each of a plurality of channel selecting positions and including a rotatable channel selector shaft, a vernier tuning reactance connected in said circuit for accurately adjusting the frequency of oscillation thereof and including a movable element, a disc shaped support member having a plurality of apertures in the periphery thereof, a plurality of independently adjustable members rotatably mounted in said apertures and having portions adapted effectively to engage said movable element, and a connection between said shaft and said support member for moving a different one of said adjustable members into effective engagement with said movable element for each channel selecting position of said shaft, whereby said adjustable members may be individually adjusted to control the value of said reactance for each channel selecting position of said shaft.

References Cited in the file of this patent

UNITED STATES PATENTS

| | | |
|---|---|---|
| 1,904,165 | Mullner | Apr. 18, 1933 |
| 2,521,968 | De Tar et al. | Sept. 12, 1950 |
| 2,533,810 | Jacob et al. | Dec. 12, 1950 |
| 2,562,263 | Ehrlich | July 31, 1951 |
| 2,600,119 | Lazzery | June 10, 1952 |
| 2,864,946 | Achenbach | Dec. 16, 1958 |

FOREIGN PATENTS

| | | |
|---|---|---|
| 684,041 | Great Britain | Dec. 10, 1952 |